US012628622B2

(12) United States Patent
Heo et al.

(10) Patent No.: US 12,628,622 B2
(45) Date of Patent: May 12, 2026

(54) SEMICONDUCTOR CHIP HAVING CHAMFER REGION FOR CRACK PREVENTION

(71) Applicant: Samsung Electronics Co., Ltd., Suwon-si (KR)

(72) Inventors: Hyunhaeng Heo, Suwon-si (KR); Sunghoon Kim, Suwon-si (KR); Jaeick Son, Suwon-si (KR); Seungyeon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 481 days.

(21) Appl. No.: 18/103,747

(22) Filed: Jan. 31, 2023

(65) Prior Publication Data

US 2024/0038603 A1    Feb. 1, 2024

(30) Foreign Application Priority Data

Jul. 28, 2022    (KR) ........................ 10-2022-0094216

(51) Int. Cl.
    *H10B 80/00*      (2023.01)
    *H01L 21/66*      (2006.01)
(52) U.S. Cl.
    CPC ............. *H01L 22/32* (2013.01); *H10B 80/00* (2023.02)
(58) Field of Classification Search
    CPC ................................ H01L 22/32; H10B 80/00
    See application file for complete search history.

(56) References Cited

U.S. PATENT DOCUMENTS

| | | | |
|---|---|---|---|
| 7,378,720 B2 | 5/2008 | Fu et al. | |
| 8,076,756 B2 | 12/2011 | Lane et al. | |
| 8,710,630 B2 | 4/2014 | Chen | |
| 8,829,653 B2 | 9/2014 | Su et al. | |
| 9,984,945 B2 | 5/2018 | Cho et al. | |
| 10,490,514 B2 | 11/2019 | Baek et al. | |
| 2005/0017363 A1 | 1/2005 | Lin et al. | |
| 2006/0104101 A1 | 5/2006 | Chen et al. | |
| 2013/0015561 A1 | 1/2013 | Chen | |
| 2013/0048980 A1 | 2/2013 | Yang et al. | |
| 2013/0099391 A1 | 4/2013 | Lamorey et al. | |
| 2017/0345773 A1* | 11/2017 | Baek ....................... H01L 22/34 |
| 2021/0020236 A1* | 1/2021 | Baek .................. G11C 13/0069 |
| 2021/0118813 A1* | 4/2021 | Ho .......................... H10D 1/665 |

FOREIGN PATENT DOCUMENTS

KR      1020170133146 A      12/2017

OTHER PUBLICATIONS

Partial European Patent Office Search Report dated Jan. 15, 2024 issued by the European Paten Office for the corresponding EP Patent Application 23181202.5.

* cited by examiner

*Primary Examiner* — Timor Karimy
(74) *Attorney, Agent, or Firm* — Muir Patent Law, PLLC

(57)                ABSTRACT
A semiconductor chip including a guard ring that surrounds edges of a semiconductor substrate, an internal circuit structure that is formed on the semiconductor substrate and that includes a memory cell array region and a peripheral circuit region, and a crack detection circuit that is located between the guard ring and the internal circuit structure and that detects whether a crack occurs. The semiconductor chip further includes first to fourth chamfer regions having different shapes and sizes depending on the position of a pad or the design arrangement of the internal circuit structure.

20 Claims, 10 Drawing Sheets

FIG.4

SEMICONDUCTOR CHIP HAVING CHAMFER REGION FOR CRACK PREVENTION

CROSS-REFERENCE TO RELATED APPLICATIONS

This application claims priority under 35 U.S.C. § 119 to Korean Patent Application No. 10-2022-0094216 filed on Jul. 28, 2022, in the Korean Intellectual Property Office, the disclosure of which is incorporated by reference herein in its entirety.

BACKGROUND

Embodiments of the present disclosure described herein relate to a semiconductor chip, and more particularly, relate to a semiconductor chip having chamfer regions for preventing cracks in corners thereof.

Semiconductor chips are manufactured through a die sawing process of cutting a semiconductor wafer. During the die sawing process, the semiconductor wafer is cut along scribe lane regions by a sawing blade, and thus the semiconductor chips are physically separated from one another. As high-capacity and high-integration integrated circuit elements are required, the area occupied by the scribe lane regions in the semiconductor wafer is reduced.

Due to stress applied to a semiconductor chip during a die sawing process, a risk of damage to an integrated circuit element increases. In particular, there is a high risk of damage to chamfer regions that are four corners of the semiconductor chip. The chamfer regions, which are chamfered corner portions between a guard ring and a crack detection circuit, may include a metal pattern structure. The metal pattern structure may prevent crack propagation that is likely to occur in the die sawing process and may reduce defects of an internal circuit structure.

In general, the chamfer regions of the semiconductor chip have the same shape and size at the four corners of the semiconductor chip. The chamfer regions may have the shape of a right triangle in the corner portions of the semiconductor chip. However, in the semiconductor chip, the design arrangement of the internal circuit structure or the position of a pad may be changed according to the development of process and design technologies. Accordingly, a semiconductor chip needs to be designed to have, at four corners thereof, chamfer regions having different shapes and sizes.

SUMMARY

Embodiments of the present disclosure provide a semiconductor chip including chamfer regions having different shapes and sizes depending on the design arrangement of an internal circuit structure or the position of a pad.

According to example embodiments, a semiconductor device includes a guard ring surrounding edges of a semiconductor substrate; an internal circuit structure formed on the semiconductor substrate and including a memory cell array region and a peripheral circuit region; a crack detection circuit located between the guard ring and the internal circuit structure and configured to detect whether a crack occurs; a first chamfer region defined as an interior region of a right triangle with a first point, a second point, and a third point as vertices, wherein a first horizontal detection line and a first corner detection line of the crack detection circuit meet each other at the first point, the first corner detection line and a first vertical detection line of the crack detection line and a first vertical detection line of the crack detection circuit meet each other at the second point, and an extension line of the first horizontal detection line and an extension line of the first vertical detection line of the crack detection circuit meet each other at the third point; and a second chamfer region defined as an interior region of a right triangle with a fourth point, a fifth point, and a sixth point as vertices, wherein the first vertical detection line and a second corner detection line of the crack detection circuit meet each other at the fourth point, the second corner detection line and a second horizontal detection line of the crack detection circuit meet each other at the fifth point, and an extension line of the first vertical detection line and an extension line of the second horizontal detection line of the crack detection circuit meet each other at the sixth point, wherein a length between the fourth point and the sixth point of the second chamfer region differs from a length between the second point and the third point of the first chamfer region due to a pad located between the second horizontal detection line and the internal circuit structure.

According to example embodiments, a semiconductor device includes a guard ring surrounding edges of a semiconductor substrate; an internal circuit structure formed on the semiconductor substrate and including a memory cell array region and a peripheral circuit region; a crack detection circuit located between the guard ring and the internal circuit structure and configured to detect whether a crack occurs; a first chamfer region defined as an interior region of a right triangle with a first point, a second point, and a third point as vertices, wherein a first horizontal detection line and a first corner detection line of the crack detection circuit meet each other at the first point, the first corner detection line and a first vertical detection line of the crack detection circuit meet each other at the second point, and an extension line of the first horizontal detection line and an extension line of the first vertical detection line of the crack detection circuit meet each other at the third point; and a second chamfer region defined as an interior region of a right triangle with a fourth point, a fifth point, and a sixth point as vertices, wherein the first vertical detection line and a second corner detection line of the crack detection circuit meet each other at the fourth point, the second corner detection line and a second horizontal detection line of the crack detection circuit meet each other at the fifth point, and an extension line of the first vertical detection line and an extension line of the second horizontal detection line of the crack detection circuit meet each other at the sixth point, wherein a zone without transistors is located between the first horizontal detection line and the internal circuit structure, and magnitudes of interior angles at the first point and the second point of the first chamfer region differ from each other.

According to example embodiments, a semiconductor device includes an upper chip including a memory cell array region; and a lower chip including a peripheral circuit region, the lower chip being connected to the upper chip by a bonding method. The upper chip and the lower chip includes a guard ring configured to surround edges of a semiconductor substrate; an internal circuit structure formed on the semiconductor substrate, the internal circuit structure including the memory cell array region or the peripheral circuit region; and a crack detection circuit located between the guard ring and the internal circuit structure and configured to detect whether a crack occurs. The semiconductor chip further includes a first chamfer region defined as an interior region of a right triangle with a first point, a second point, and a third point as vertices, wherein a first horizontal detection line and a first corner detection line of the crack detection circuit meet each other at the first point, the first corner detection line and a first vertical detection line of the crack detection circuit meet each other at the second point, and an extension line of the first horizontal detection line and an extension line of the first vertical detection line of the crack detection circuit meet each other at the third point; and a second chamfer region defined as an interior region of a right triangle with a fourth point, a fifth point, and a sixth point as vertices, wherein the first vertical detection line and a second corner detection line of the crack detection circuit meet each other at the fourth point, the second corner detection line and a second horizontal detection line of the crack detection circuit meet each other at the fifth point, and an extension line of the first vertical detection line and an extension line of the second horizontal detection line of the crack detection circuit meet each other at the sixth point, and wherein a length between the fourth point and the sixth point of the second chamfer region is greater than a length between the second point and the third point of the first chamfer region due to a pad located between the second horizontal detection line and the internal circuit structure.

BRIEF DESCRIPTION OF THE FIGURES

FIG. 4 is an enlarged view of the first chamfer region illustrated in FIG. 3 according to an exemplary embodiment.

DETAILED DESCRIPTION

Hereinafter, exemplary embodiments of the present disclosure will be described clearly and in detail to such an extent that those skilled in the art may easily implement the present disclosure.

Figure 1:
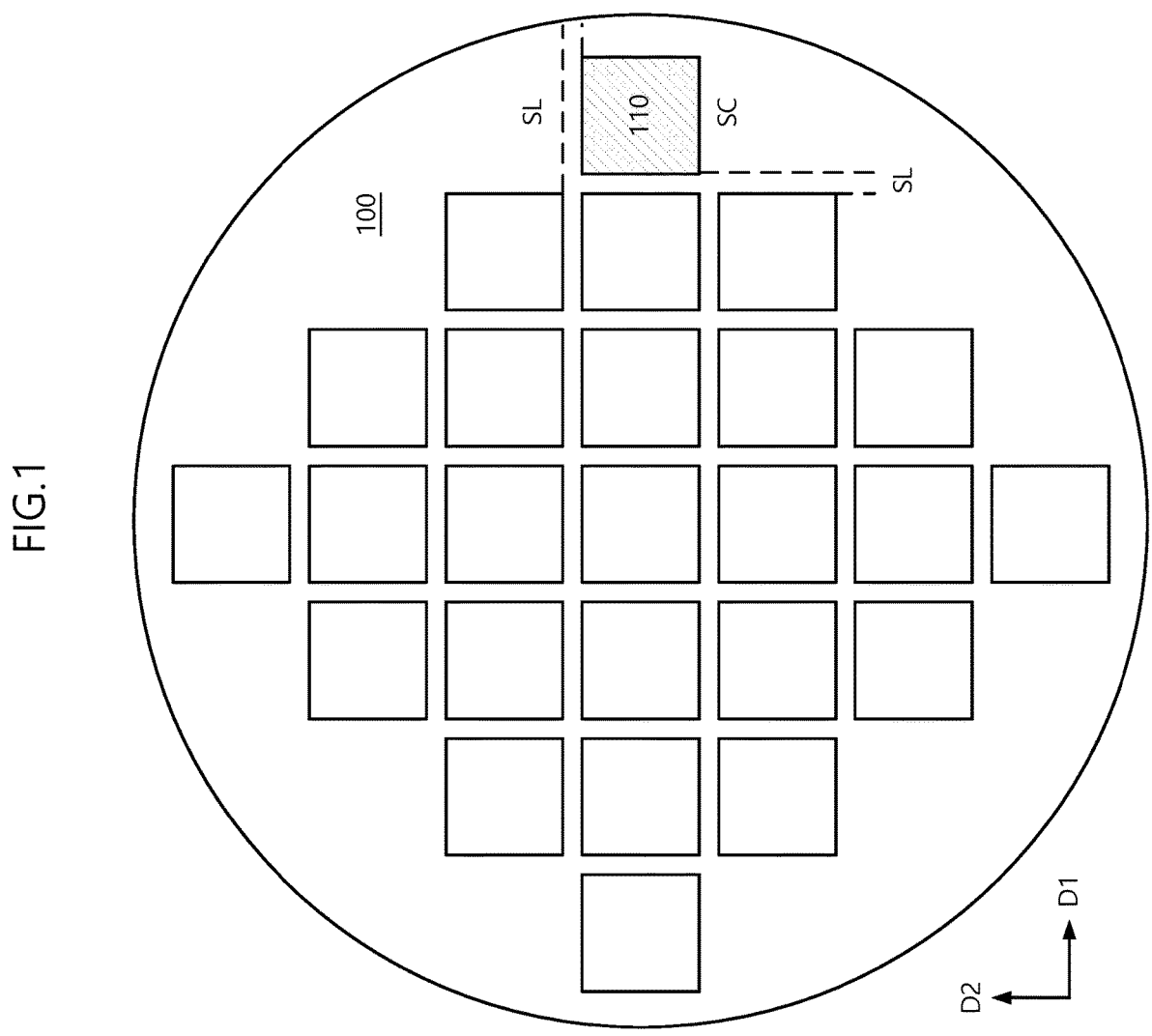
FIG. 1 is a schematic plan view illustrating a semiconductor wafer according to exemplary embodiments.

FIG. 1 is a schematic plan view illustrating a semiconductor wafer. Referring to FIG. 1, the semiconductor wafer 100 includes semiconductor chip regions SC and scribe lane regions SL. The semiconductor chip regions SC are constituted by a plurality of semiconductor chips. The scribe lane regions SL are regions between the semiconductor chips.

The semiconductor wafer 100 may include a semiconductor element material such as silicon (SI) or germanium (Ge), or a compound semiconductor material such as silicon carbide (SiC), gallium arsenide (GaAs), indium arsenide (InAs), or indium phosphide (InP). The semiconductor wafer 100 may have a silicon-on-insulator (SOI) structure.

The semiconductor wafer 100 has an upper surface on which the semiconductor chips (e.g., 110) are formed and a lower surface facing away from the upper surface. The plurality of semiconductor chips may be arranged on the upper surface of the semiconductor wafer 100 in a first direction D1 and a second direction D2. A polishing process may be performed on the lower surface to reduce the thickness of the semiconductor wafer 100.

The scribe lane regions SL may extend in the first and second directions D1 and D2. The scribe lane regions SL may have a straight lane (e.g., line) shape having a constant width. The semiconductor chips 110 may be surrounded by the scribe lane regions SL and may be spaced apart from one another accordingly. In general, the semiconductor chips 110 may be separated from one another by performing a die sawing process along the scribe lane regions SL.

As the semiconductor chips 110 are highly integrated, the scribe lane regions SL of the semiconductor wafer 100 are gradually reduced. Stress caused by the die sawing process in the first and second directions D1 and D2 may be accumulated in corner portions of each of the semiconductor chips 110. Due to the stress during the die sawing process, a risk of damage to an internal circuit of the semiconductor chip 110 increases.

Figure 2:
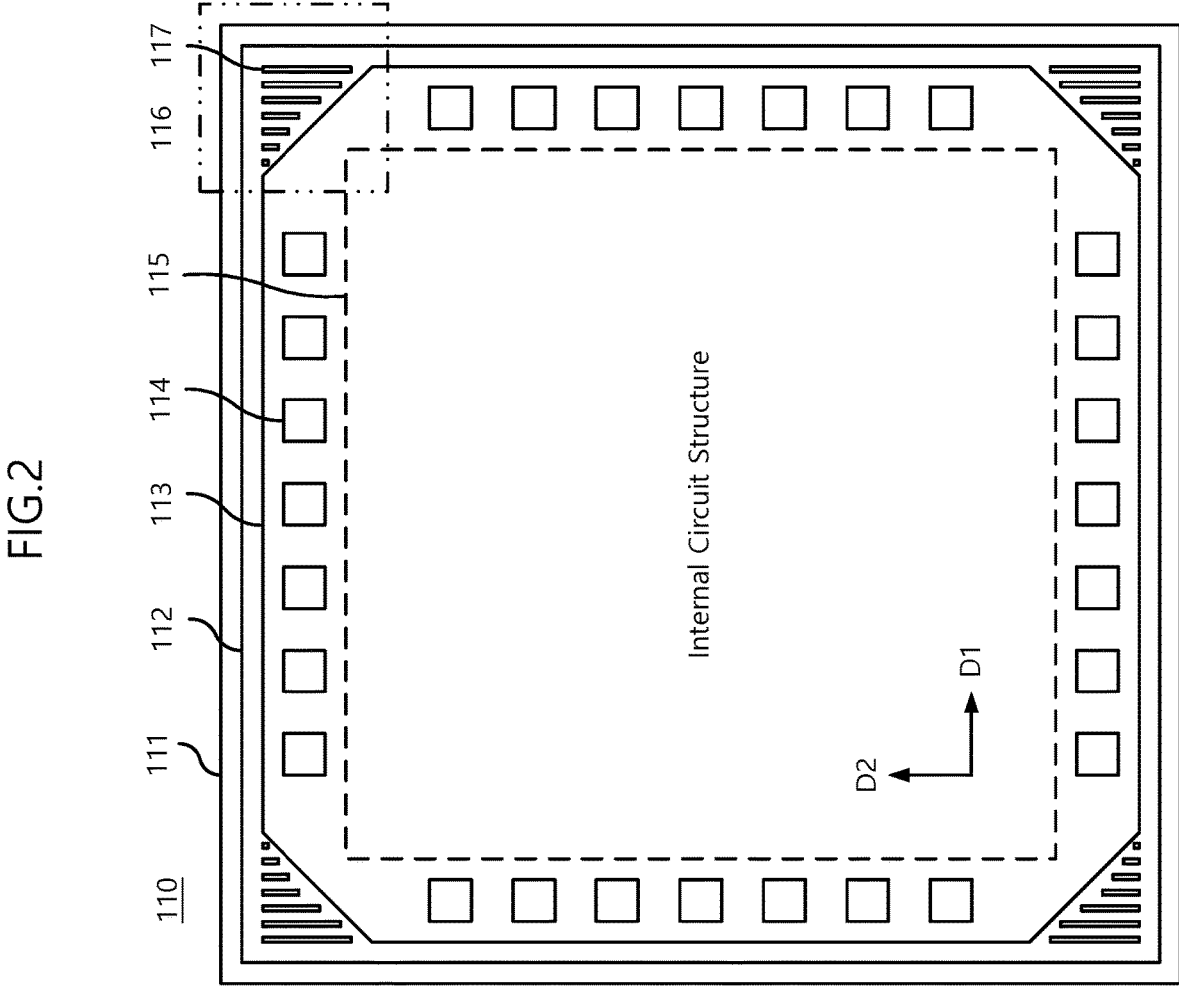
FIG. 2 is a plan view illustrating a common example of the semiconductor chip illustrated in FIG. 1.

FIG. 2 is a plan view illustrating a common example of the semiconductor chip illustrated in FIG. 1. Referring to FIG. 2, one semiconductor chip 110 separated by the scribe lane regions SL (refer to FIG. 1) is illustrated.

The semiconductor chip 110 includes a substrate 111, a guard ring 112, a crack detection circuit (CDC) 113, pads 114, and an internal circuit structure 115. The semiconductor chip 110 may include, at four corners thereof, chamfer regions 116 having the same shape. Each of the chamfer regions 116 may include metal pattern structures 117.

The substrate 111 may be obtained by dicing the semiconductor chip 110 illustrated in FIG. 1 in a predetermined size. In FIG. 2, the substrate 111 is illustrated as having a square shape. However, the substrate 111 may have a rectangular shape in which one pair of sides extending in the first direction D1 or the second direction D2 is longer than the other pair. The quadrangular guard ring 112 surrounding the internal circuit structure 115 may be formed at the outermost periphery of the substrate 111.

The guard ring 112 may have a quadrangular shape surrounding edges of the internal circuit structure 115 that extend in the first and second directions D1 and D2. The guard ring 112 may be formed of one or more guard rings. For example, the guard ring 112 may have a double layer structure surrounding the edges of the internal circuit structure 115.

The crack detection circuit 113 is a circuit for determining whether the semiconductor chip 110 is cracked, by measuring resistance values in a predetermined contact region and analyzing the pattern of the measured resistance values. In some embodiments, the crack detection circuit 113 may be formed to surround a central portion of the internal circuit structure 115. Corner portions of the crack detection circuit 113 may be cut away in a chamfer shape. Accordingly, the crack detection circuit 113 may have an overall octagonal shape. The crack detection circuit 113 may be formed to surround the central portion of the internal circuit structure 115 two or more times. The pads 114 may be formed between the crack detection circuit 113 and the internal circuit structure 115. The pads 114 may electrically connect an internal circuit of the semiconductor chip 110 and an external circuit. As illustrated in FIG. 2, the pads 114 may be located on four portions between the crack detection circuit 113 and the internal circuit structure 115. The internal circuit structure 115 may be formed on a central portion of the substrate 111 inward of the pads 114. The internal circuit structure 115 may have a quadrangular shape. The internal circuit structure 115 may include a memory cell and a peripheral circuit. The peripheral circuit may include an analog circuit and a digital circuit.

Meanwhile, the chamfer regions 116 may be four corner portions of the semiconductor chip 110. The chamfer regions 116 may be chamfered corner portions between the guard ring 112 and the crack detection circuit 113. Each of the chamfer regions 116 may include the metal pattern structures 117. The metal pattern structures 117 may sequentially have different lengths and may be arranged parallel to each other. The metal pattern structures 117 may prevent crack propagation that is likely to occur in a die sawing process and may reduce defects of the internal circuit structure 115.

In general, the semiconductor chip 110 may have, at the four corners thereof, the chamfer regions 116 having the same shape and size. In the chamfer region 116 at each corner, the metal pattern structures 117 may form a right triangle in which two sides extending in the first and second directions D1 and D2 have the same length. However, in the semiconductor chip 110, the design arrangement of the internal circuit structure 115 or the positions of the pads 114 may be changed according to the development of process and design technologies. Accordingly, the semiconductor chip 110 needs to be designed to have, at the four corners thereof, the chamfer regions 116 having different shapes and sizes.

Figure 3:
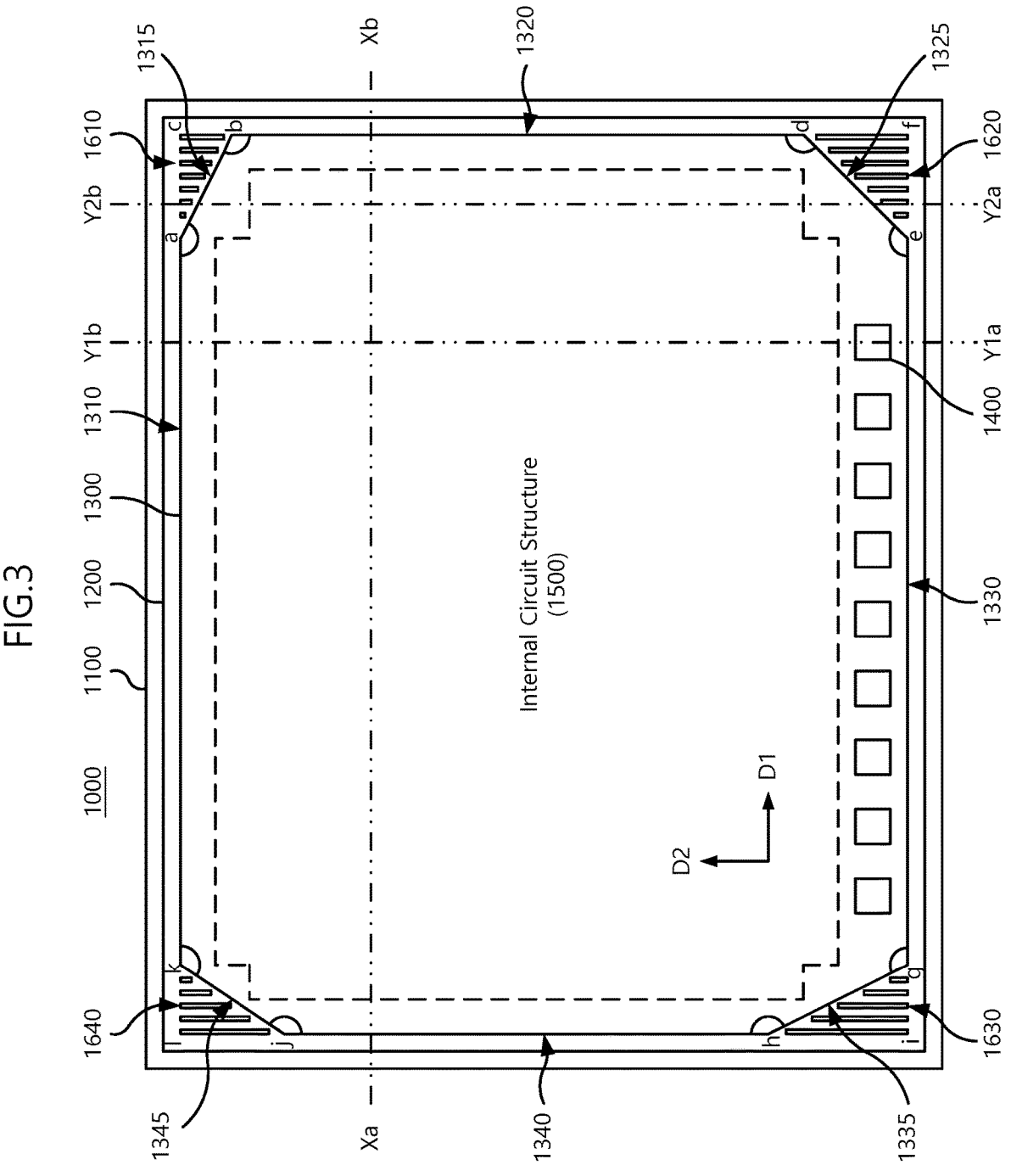
FIG. 3 is a plan view illustrating a semiconductor chip according to an exemplary embodiment.

FIG. 3 is a plan view illustrating a semiconductor chip according to an embodiment of the present disclosure. Referring to FIG. 3, the semiconductor chip 1000 includes a substrate 1100, a guard ring 1200, a crack detection circuit 1300, a pad 1400, and an internal circuit structure 1500. The semiconductor chip 1000 may include first to fourth chamfer regions 1610, 1620, 1630, and 1640 in first to fourth corner portions, respectively, of the semiconductor chip 1000.

The substrate 1100 may have a square shape or a rectangular shape. The substrate 1100 may have horizontal sides and vertical sides perpendicular to each other. Referring to FIG. 3, the horizontal sides may be long sides extending in the first direction D1. The vertical sides may be short sides extending in the second direction D2.

The guard ring 1200 may be formed at the outermost periphery of the substrate 1100. The guard ring 1200 may have a rectangular dam structure surrounding the internal circuit structure 1500. The guard ring 1200 is a structure that surrounds edges of the semiconductor chip 1000, similarly to a hydroelectric dam that stops water from flowing. The guard ring 1200 may be used to prevent absorption of moisture. The guard ring 1200 may be configured in the form of a large wall and thus may exhibit circuit pattern characteristics different from those of the internal circuit structure 1500.

The crack detection circuit 1300 is also referred to as a chipping detection circuit. The crack detection circuit 1300 is a circuit for determining whether the semiconductor chip 1000 is cracked during die sawing. The crack detection circuit 1300 may be formed to surround the internal circuit structure 1500. The crack detection circuit 1300 may have an octagonal shape in which corner portions are cut away in a chamfer shape. The first to fourth chamfer regions 1610, 1620, 1630, and 1640 may be located on the four corner portions of the crack detection circuit 1300.

The first corner portion of the crack detection circuit 1300 may be constituted by a first horizontal detection line 1310, a first corner detection line 1315, and a first vertical detection line 1320. The first horizontal detection line 1310 and the first corner detection line 1315 meet each other at point "a". The first corner detection line 1315 and the first vertical detection line 1320 meet each other at point "b". An extension line of the first horizontal detection line 1310 and an extension line of the first vertical detection line 1320 meet each other at point "c". The first chamfer region 1610 may be defined as a right triangle with points "a" to "c" as vertices.

The second corner portion of the crack detection circuit 1300 may be constituted by the first vertical detection line 1320, a second corner detection line 1325, and a second horizontal detection line 1330. The first vertical detection line 1320 and the second corner detection line 1325 meet each other at point "d". The second corner detection line 1325 and the second horizontal detection line 1330 meet each other at point "e". An extension line of the first vertical detection line 1320 and an extension line of the second horizontal detection line 1330 meet each other at point "f". The second chamfer region 1620 may be defined as a right triangle with points "d" to "f" as vertices.

The third corner portion of the crack detection circuit 1300 may be constituted by the second horizontal detection line 1330, a third corner detection line 1335, and a second vertical detection line 1340. The second horizontal detection line 1330 and the third corner detection line 1335 meet each other at point "g". The third corner detection line 1335 and the second vertical detection line 1340 meet each other at point "h". An extension line of the second horizontal detection line 1330 and an extension line of the second vertical detection line 1340 meet each other at point "i". The third chamfer region 1630 may be defined as a right triangle with points "g" to "i" as vertices.

The fourth corner portion of the crack detection circuit 1300 may be constituted by the second vertical detection line 1340, a fourth corner detection line 1345, and the first horizontal detection line 1310. The second vertical detection line 1340 and the fourth corner detection line 1345 meet each other at point "j". The fourth corner detection line 1345 and the first horizontal detection line 1310 meet each other at point "k". An extension line of the second vertical detection line 1340 and an extension line of the first horizontal detection line 1310 meet each other at point "l". The fourth chamfer region 1640 may be defined as a right triangle with points "j" to "l" as vertices. Metal pattern structures may be located in the first to fourth chamfer regions 1610, 1620, 1630, and 1640.

The pad 1400 may be formed between the crack detection circuit 1300 and the internal circuit structure 1500. The pad 1400 may be located on only any one portion or a partial portion depending on the design arrangement of the internal circuit structure 1500. As can be seen in the example of FIG. 3, the pad 1400 may not be provided between the first horizontal detection line 1310 and the internal circuit structure 1500 and may be provided between the second horizontal detection line 1330 and the internal circuit structure 1500. The structures or shapes of the chamfer regions may vary depending on the position of the pad 1400.

The internal circuit structure 1500 may be formed on a central portion of the substrate 1100 inward of the pad 1400. The internal circuit structure 1500 may include a peripheral circuit region and a memory cell array region. The peripheral circuit region may include an analog circuit and a digital circuit. The peripheral circuit region may include circuits for storing data in the memory cell array region or reading the stored data.

The internal circuit structure 1500 may have various structures depending on the design arrangement thereof. For example, the memory cell array region of the internal circuit structure 1500 may have a three-dimensional structure. For example, a memory cell array region 5200 (refer to FIG. 7) may be a vertical NAND flash memory (VNAND). The internal circuit structure 1500 may have a cell-on-peripheral (COP) structure in which the memory cell array region 5200 (refer to FIG. 7) is located on a peripheral circuit region 5100 (refer to FIG. 7).

The structures or shapes of the chamfer regions in the semiconductor chip 1000 according to an embodiment of the present disclosure may vary depending on the position of the pad 1400 or the structure of the internal circuit structure 1500. For example, assuming that the pad 1400 is located only between the second chamfer region 1620 and the third chamfer region 1630, the first chamfer region 1610 and the second chamfer region 1620 of the semiconductor chip 1000 may have different structures and shapes. Furthermore, depending on the design arrangement of the internal circuit structure 1500, the second chamfer region 1620 and the third chamfer region 1630 or the first chamfer region 1610 and the fourth chamfer region 1640 of the semiconductor chip 1000 may have different structures and shapes.

Figure 4:
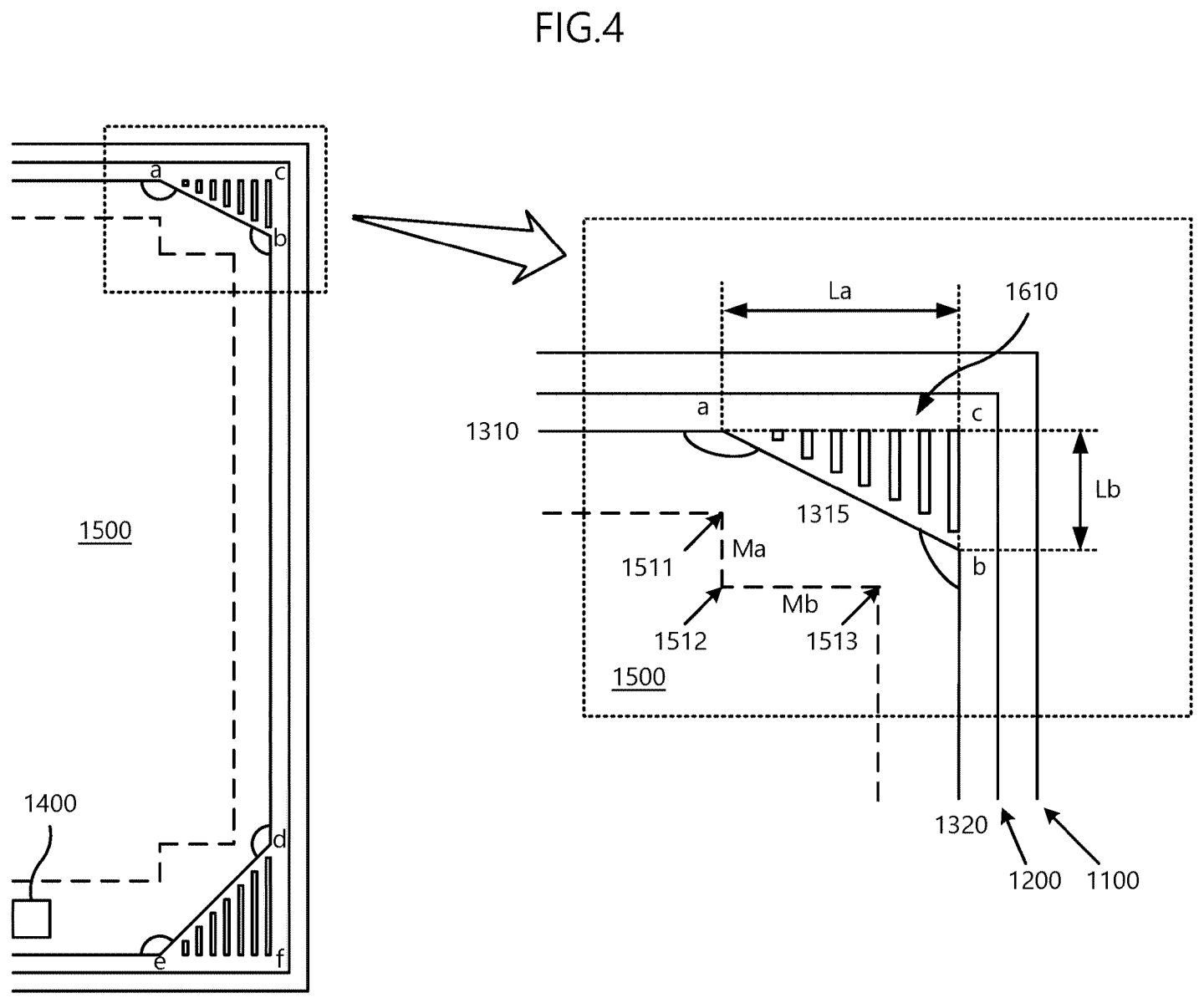
Figure 5:
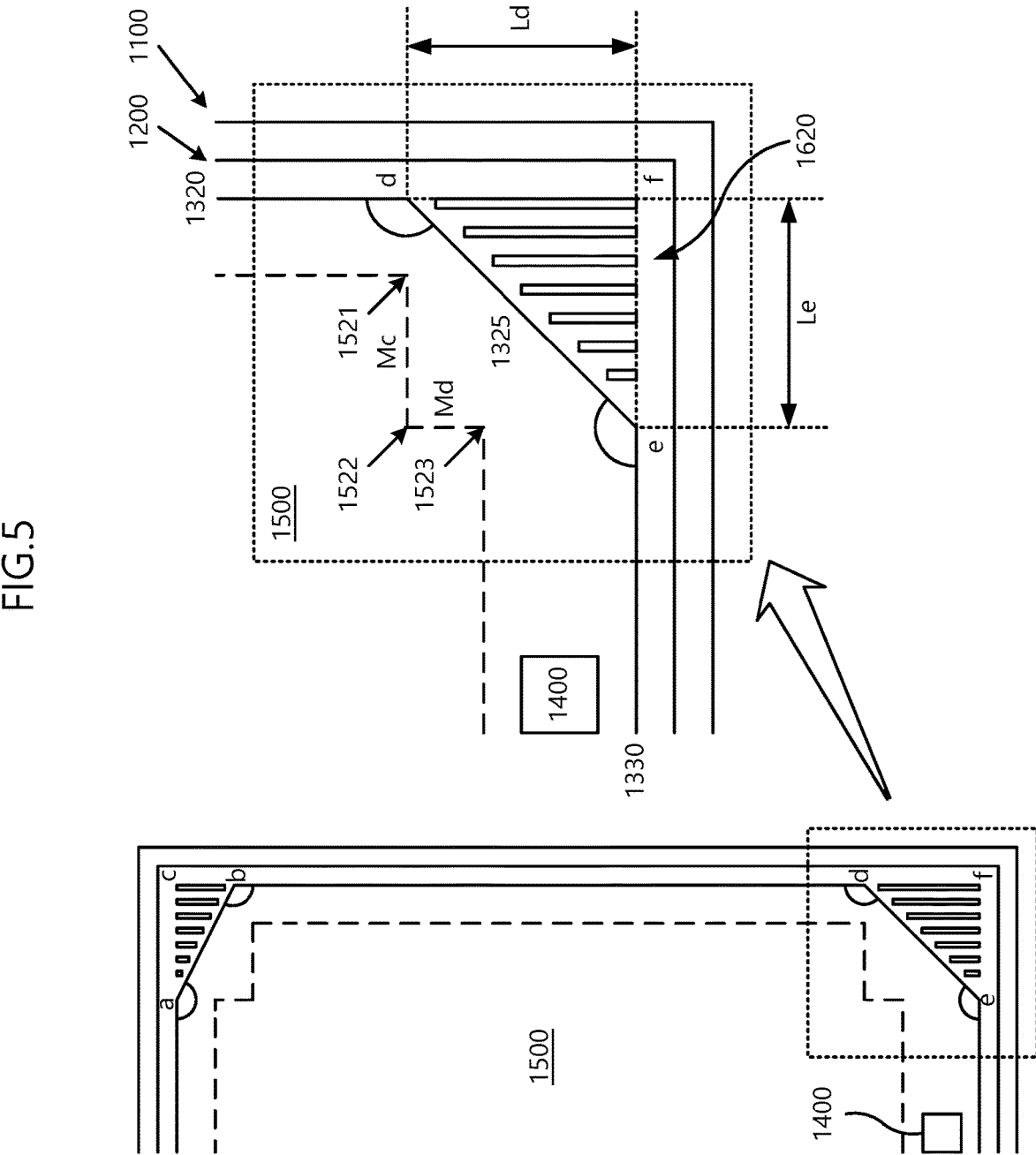
FIG. 5 is an enlarged view of the second chamfer region illustrated in FIG. 3 according to an exemplary embodiment.

FIG. 4 is an enlarged view of the first chamfer region 1610 illustrated in FIG. 3, and FIG. 5 is an enlarged view of the second chamfer region 1620 illustrated in FIG. 3. Referring to FIGS. 4 and 5, the first chamfer region 1610 and the second chamfer region 1620 may be the first corner portion and the second corner portion between the guard ring 1200 and the crack detection circuit 1300.

Referring to FIG. 4, the first corner portion of the crack detection circuit 1300 may be constituted by the first horizontal detection line 1310, the first corner detection line 1315, and the first vertical detection line 1320. The first chamfer region 1610 may be an interior region of a right triangle with points "a" to "c" as vertices. Metal pattern structures may be located in the first chamfer region 1610.

The length between point "a" and point "c" of the first chamfer region 1610 may be La, and the length between point "b" and point "c" of the first chamfer region 1610 may be Lb. The magnitude of an interior angle formed by the first horizontal detection line 1310 and the first corner detection line 1315 at point "a" of the crack detection circuit 1300 may be an angle of "a". The magnitude of an interior angle formed by the first corner detection line 1315 and the first vertical detection line 1320 at point "b" may be an angle of "b".

The internal circuit structure 1500 inward of the first chamfer region 1610 may have a stepped boundary. The length between a first boundary point 1511 and a second boundary point 1512 may be Ma. The length between the second boundary point 1512 and a third boundary point 1513 may be Mb. The shape and size of the first chamfer region 1610 may vary depending on the shape of the boundary of the internal circuit structure 1500. That is, the magnitudes of the interior angles "a" and "b" or the lengths La and Lb may vary.

Referring to FIG. 5, the second corner portion of the crack detection circuit 1300 may be constituted by the first vertical detection line 1320, the second corner detection line 1325, and the second horizontal detection line 1330. The second chamfer region 1620 may be an interior region of a right triangle with points "d" to "f" as vertices. Metal pattern structures may be located in the second chamfer region 1620.

The length between point "d" and point "f" of the second chamfer region 1620 may be Ld, and the length between point "e" and point "f" of the second chamfer region 1620 may be Le. The magnitude of an interior angle formed by the first vertical detection line 1320 and the second corner detection line 1325 at point "d" of the crack detection circuit 1300 may be an angle of "d". The magnitude of an interior angle formed by the second corner detection line 1325 and the second horizontal detection line 1330 at point "e" may be an angle of "e".

The internal circuit structure 1500 inward of the second chamfer region 1620 may have a stepped boundary. The length between a fourth boundary point 1521 and a fifth boundary point 1522 may be Mc. The length between the fifth boundary point 1522 and a sixth boundary point 1523 may be Md. The shape and size of the second chamfer region 1620 may vary depending on the shape of the boundary of the internal circuit structure 1500. That is, the magnitudes of the interior angles "d" and "e" or the lengths Ld and Le may vary.

Referring to FIGS. 4 and 5, the shapes and sizes of different chamfer regions in the semiconductor chip 1000 may vary depending on the presence or absence of the pad 1400. For example, no pad exists near the first chamfer region 1610 of FIG. 4, and the pad 1400 exists near the second chamfer region 1620 of FIG. 5. The first and second chamfer regions 1610 and 1620 may have different shapes and sizes depending on the presence or absence of the pad 1400. Due to the pad 1400, the length Ld between point "d" and point "f" of the second chamfer region 1620 may be greater than the length Lb between point "b" and point "c" of the first chamfer region 1610.

The shapes and sizes of the respective chamfer regions in the semiconductor chip 1000 may vary depending on the design arrangement of the internal circuit structure 1500. The magnitudes of interior angles and the lengths between points in the respective chamfer regions may vary. The shape of the boundary of the internal circuit structure 1500 may vary depending on the design arrangement of the memory cell array region and the peripheral circuit region. That is, Ma and Mb may vary depending on the starting point or slope of the memory cell array region, the starting point of the peripheral circuit region, or the arrangement of peripheral edge circuits (e.g., a pass transistor). Alternatively, Ma and Mb may vary depending on a COP structure or a non-COP structure.

Figure 6:
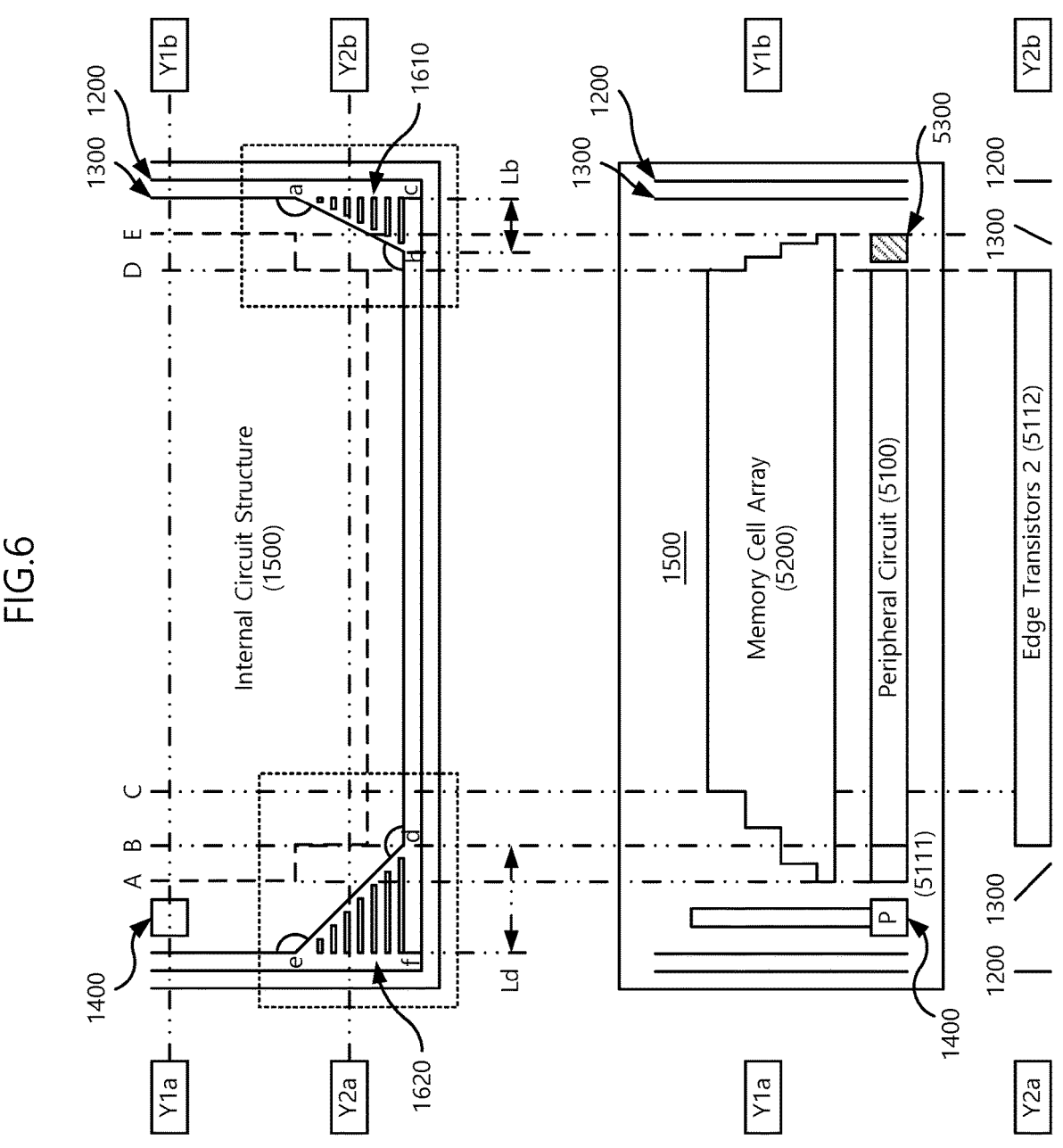
FIG. 6 illustrates vertical sections of the semiconductor chip taken along lines Y1a-Y1b and Y2a-Y2b of FIG. 3 according to an exemplary embodiment.

FIG. 6 illustrates vertical sections of the semiconductor chip taken along lines Y1a-Y1b and Y2a-Y2b of FIG. 3. Referring to FIG. 6, the vertical section taken along line Y1a-Y1b is a section passing through the pad 1400, and the vertical section taken along line Y2a-Y2b is a section passing through the first and second chamfer regions 1610 and 1620.

When the vertical section taken along line Y1a-Y1b is viewed, the pad 1400 exists on a Y1a side and does not exist on a Y1b side. Since no pad exists on the Y1b side, a vertical pattern of the memory cell array 5200 may have a steep slope on the Y1b side to reduce the size of the semiconductor chip 1000. In contrast, since regions for connection with the pad 1400 are required on the Y1a side, the vertical pattern of the memory cell array 5200 may have a gentle slope.

Since the vertical pattern of the memory cell array 5200 has the steep slope on the Y1b side, active stress may increase. To reduce the active stress on the Y1b side, the internal circuit structure 1500 may include a zone 5300 without transistors. Since the zone 5300 without transistors is a region in which there is no transistor, the zone 5300 without transistors may be located under the steep slope of the memory cell array 5200. The zone 5300 without transistors may be located between the peripheral circuit region 5100 and the crack detection circuit 1300.

In contrast, since the vertical pattern of the memory cell array 5200 has the gentle slope on the Y1*a* side, active stress is relatively small. Accordingly, there is no need for a zone without transistors on the Y1*a* side. On the Y1*a* side, the peripheral circuit region 5100 may be located under the gentle slope of the memory cell array 5200. The pad 1400 may be located between the peripheral circuit region 5100 and the crack detection circuit 1300.

A plurality of edge transistors for performing various functions may be located at the periphery of the peripheral circuit region 5100. For example, edge dummy transistors, RMON pass transistors, and pass transistors constituting a row decoder may be located at the periphery of the peripheral circuit region 5100. FIG. 6 illustrates one example that first edge transistors 5111 are located at the periphery of the peripheral circuit region 5100.

When the vertical section taken along line Y2*a*-Y2*b* is viewed, second edge transistors 5112 may be located at the periphery of the peripheral circuit region 5100. Pass transistors for selecting a row of the memory cell array 5200 or resistor monitoring pass transistors may be included in the second edge transistors 5112.

Since a space for pad connection is required on the Y2*a* side, the vertical pattern of the memory cell array 5200 has a gentle slope. The second chamfer region 1620 may secure a sufficient space between the second edge transistors 5112 and the guard ring 1200. The crack detection circuit 1300 of the second chamfer region 1620 may have a gentle slope.

In contrast, the vertical pattern of the memory cell array 5200 has a steep slope on the Y2*b* side. In the case of the first chamfer region 1610, a space between the second edge transistors 5112 and the guard ring 1200 is relatively small. The crack detection circuit 1300 of the first chamfer region 1610 may have a steep slope.

Accordingly, the length Ld (refer to FIG. 5) between point "d" and point "f" of the second chamfer region 1620 may be greater than the length Lb (refer to FIG. 4) between point "b" and point "c" of the first chamfer region 1610. That is, the first and second chamfer regions 1610 and 1620 may have different sizes and shapes depending on the presence or absence of the pad 1400 or the design structure of the internal circuit structure 1500.

Figure 7:
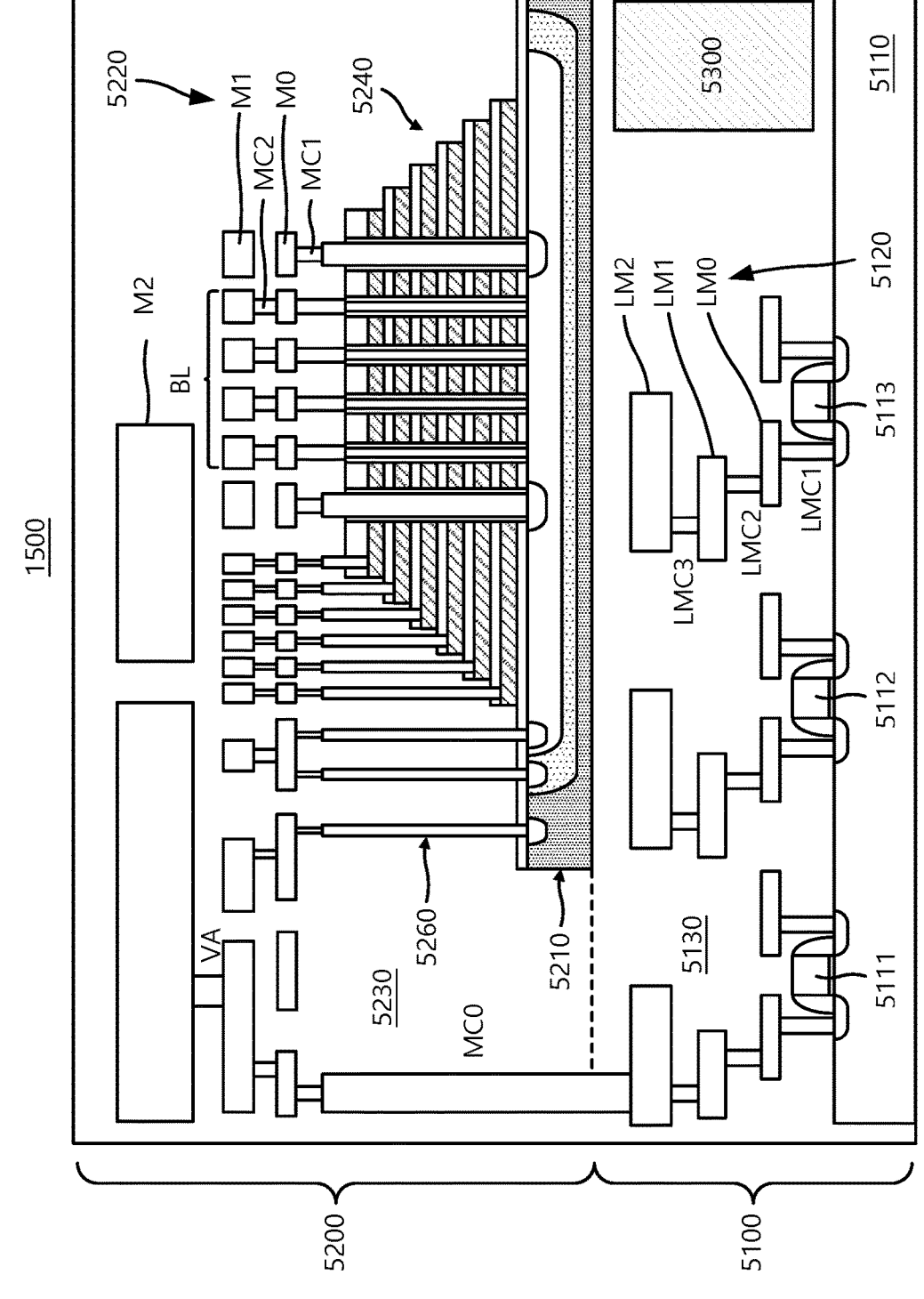
FIG. 7 is a vertical sectional view illustrating the internal circuit structure illustrated in FIG. 6 according to an exemplary embodiment.

FIG. 7 is a vertical sectional view illustrating the internal circuit structure illustrated in FIG. 6. Referring to FIG. 7, the internal circuit structure 1500 may have a cell-on-peripheral (COP) structure in which the memory cell array region 5200 is stacked on the peripheral circuit region 5100. At least a portion of the peripheral circuit region 5100 and at least a portion of the memory cell array region 5200 may vertically overlap each other.

The peripheral circuit region 5100 may include one or more peripheral transistors 5112 disposed on a lower substrate 5110, peripheral circuit region wiring 5120 electrically connected with the peripheral transistors 5112, and a lower insulating layer 5130 covering the peripheral circuit region wiring 5120 and the peripheral transistors 5112. The peripheral circuit region 5100 may include the zone 5300 without transistors. Since the zone 5300 without transistors is a region in which there is no transistor, the zone 5300 without transistors may be located under the steep slope of the memory cell array 5200.

The memory cell array region 5200 has a structure in which memory cells are vertically stacked. One side of the memory cell array region 5200 may have a gentle slope for connection wiring with the pad, and an opposite side of the memory cell array region 5200 may have a steep slope to reduce a chip size.

The memory cell array region 5200 may include an upper substrate 5210, a memory cell array 5240 disposed on the upper substrate 5210, and an upper insulating layer 5230 covering the memory cell array 5240. The memory cell array region 5200 may further include connection circuit wiring 5220 electrically connecting the memory cell array 5240 and the peripheral circuit region wiring 5120. The memory cell array region 5200 may include a metal contact 5260 electrically connecting the memory cell array 5240 to the connection circuit wiring 5220.

In the peripheral circuit region 5100, the lower substrate 5110 may include, for example, a semiconductor substrate such as a silicon wafer. The peripheral circuit region wiring 5120 may include, for example, a lower metal line LM0, an intermediate metal line LM1, and an upper metal line LM2 sequentially stacked on the lower substrate 5110.

The peripheral circuit region wiring 5120 may further include a lower metal contact LMC1 electrically connecting the peripheral transistors 5112 to the lower metal line LM0, an intermediate metal contact LMC2 electrically connecting the lower metal line LM0 to the intermediate metal line LM1, and an upper metal contact LMC3 electrically connecting the intermediate metal line LM1 to the upper metal line LM2.

In the memory cell array region 5200, the memory cell array 5240 may have a three-dimensional structure in which a plurality of cells are vertically stacked on the upper substrate 5210 having a well structure. The metal contact 5260 may electrically connect the plurality of cells of the memory cell array 5240 and the upper substrate 5210 to the connection circuit wiring 5220.

The connection circuit wiring 5220 may be electrically connected with the peripheral circuit region wiring 5120. The connection circuit wiring 5220 may include a lower metal line M0, an intermediate metal line M1, and an upper metal line M2 sequentially stacked on the memory cell array 5240. The connection circuit wiring 5220 may further include a connection metal contact MC0, a lower metal contact MC1, an intermediate metal contact MC2, and a via VA as an upper metal contact.

The connection metal contact MC0 may electrically connect the peripheral circuit region wiring 5120 to the connection circuit wiring 5220. The lower metal contact MC1 may electrically connect the connection metal contact MC0 and the lower metal line M0. The intermediate metal contact MC2 may electrically connect the lower metal line M0 to the intermediate metal line M1. The via VA as the upper metal contact may electrically connect the intermediate metal line M1 to the upper metal line M2. The lower metal contact MC1 may connect the memory cell array 5240 to the intermediate metal line M0. The intermediate metal line M1 may include a bit line BL electrically connected with a vertical channel of the memory cell array 5240.

Figure 8:
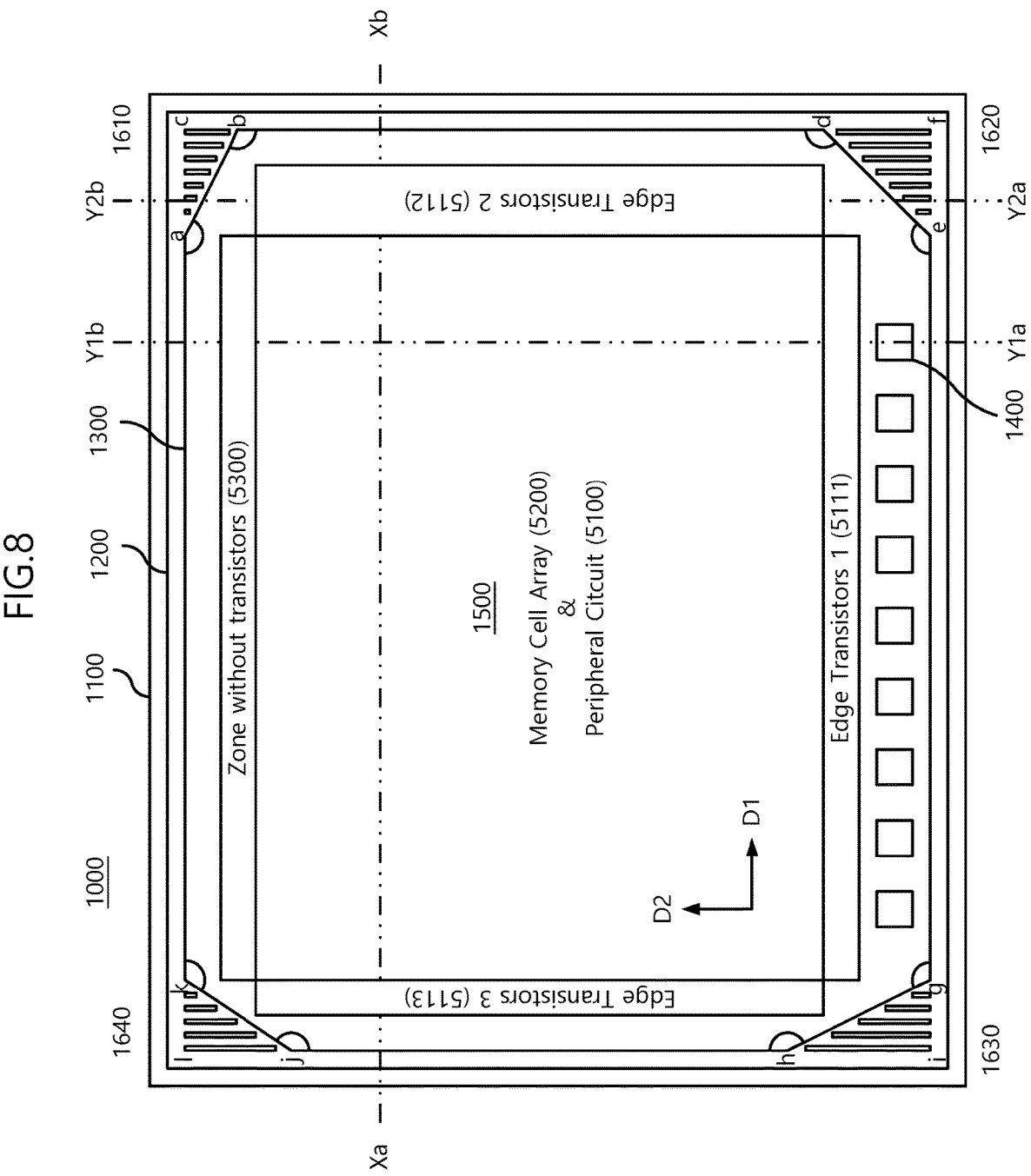
FIG. 8 is a horizontal sectional view of the semiconductor chip of FIG. 3 as viewed from above according to an exemplary embodiment.

FIG. 8 is a horizontal sectional view of the semiconductor chip of FIG. 3 as viewed from above. Referring to FIG. 8, the semiconductor chip 1000 includes the substrate 1100, the guard ring 1200, the crack detection circuit 1300, the pad 1400, and the internal circuit structure 1500. The semiconductor chip 1000 may include the first to fourth chamfer regions 1610, 1620, 1630, and 1640 in the four corner portions thereof.

The internal circuit structure 1500 may include the peripheral circuit region 5100 and the memory cell array region 5200. The peripheral circuit region 5100 may include first to third edge transistor regions 5111, 5112, and 5113 and the zone 5300 without transistors. The edge dummy transistors, the register monitoring pass transistors, and the pass transistors constituting the row decoder may be located in the first to third edge transistor regions 5111, 5112, and 5113.

The first edge transistor region 5111 may be located on the Y1*a* side. That is, the first edge transistor region 5111 may be located between main peripheral circuits of the peripheral circuit region 5100 and the pad 1400. The zone 5300 without transistors may be located on the Y1*b* side. The zone 5300 without transistors may be located between the main peripheral circuits of the peripheral circuit region 5100 and the crack detection circuit 1300.

The second edge transistor region 5112 may be located on an Xb side, and the third edge transistor region 5113 may be located on an Xa side. The second and third edge transistor regions 5112 and 5113 may each be located between the main peripheral circuits of the peripheral circuit region 5100 and the crack detection circuit 1300.

Figure 9:
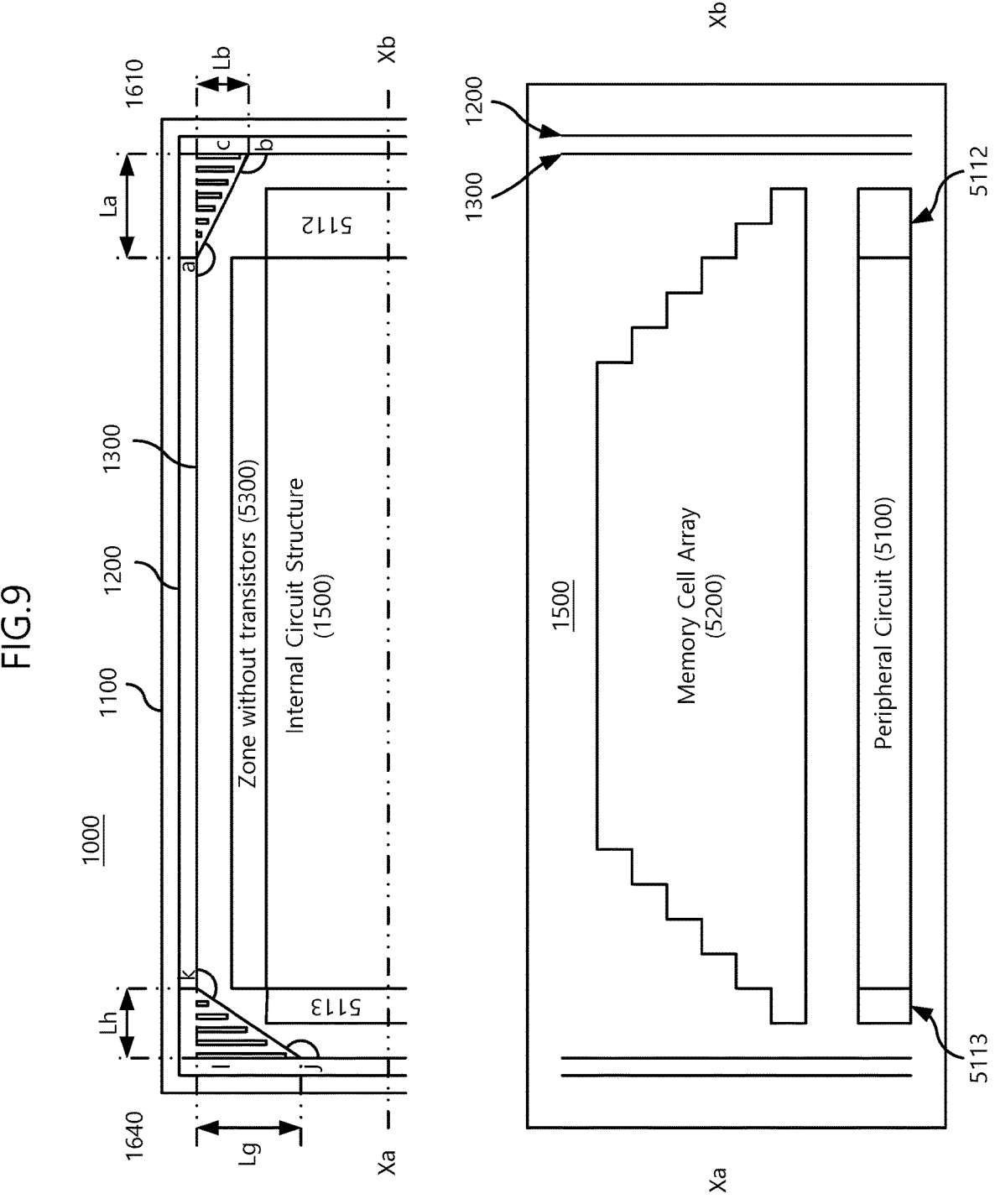
FIG. 9 illustrates a vertical section of the semiconductor chip taken along line Xa-Xb of FIG. 8 according to an exemplary embodiment.

FIG. 9 illustrates a vertical section of the semiconductor chip taken along line Xa-Xb of FIG. 8. Referring to FIG. 9, the vertical section taken along line Xa-Xb is a section passing through the vicinity of the first and fourth chamfer regions 1610 and 1640. A pad may not be located on the Xa side and the Xb side, the third edge transistor region 5113 may be located on the Xa side, and the second edge transistor region 5112 may be located on the Xb side.

The first and fourth chamfer regions 1610 and 1640 of the semiconductor chip 1000 may have different sizes and shapes depending on the sizes of the second and third edge transistor regions 5112 and 5113. For example, the horizontal length La of the first chamfer region 1610 may differ from the horizontal length Lh of the fourth chamfer region 1640. In addition, the vertical length Lb of the first chamfer region 1610 may differ from the vertical length Lg of the fourth chamfer region 1640.

Likewise, the second and third chamfer regions 1620 and 1630 of the semiconductor chip 1000 may have different sizes and shapes depending on the sizes of the second and third edge transistor regions 5112 and 5113. As described above, the first to fourth chamfer regions 1610, 1620, 1630, and 1640 of the semiconductor chip 1000 may have different sizes and shapes depending on the presence or absence of the pad 1400 or the design structure of the internal circuit structure 1500.

Since one wafer is used in the above-described COP structure, the semiconductor chip 1000 has the four chamfer regions. However, since two wafers are used in a chip-to-chip (C2C) structure, a semiconductor chip may have eight chamfer regions. Here, the C2C structure may refer to a structure in which at least one upper chip including a memory cell array region and a lower chip including a peripheral circuit region are separately manufactured and then connected to each other by a bonding method.

The bonding method may refer to a method of electrically or physically connecting a bonding metal pattern formed on the uppermost metal layer of the upper chip and a bonding metal pattern formed on the uppermost metal layer of the lower chip. For example, in a case in which the bonding metal patterns are formed of copper (Cu), the bonding method may be a Cu-to-Cu bonding method. In another example, the bonding metal patterns may be formed of aluminum (Al) or tungsten (W).

Since the first to fourth chamfer regions 1610, 1620, 1630, and 1640 of the semiconductor chip 1000 have different sizes and shapes depending on the presence or absence of the pad 1400 or the design structure of the internal circuit structure 1500, the semiconductor chip 1000 according to the embodiment of the present disclosure may be effectively used even in the C2C structure as well as the COP structure.

Figure 10:
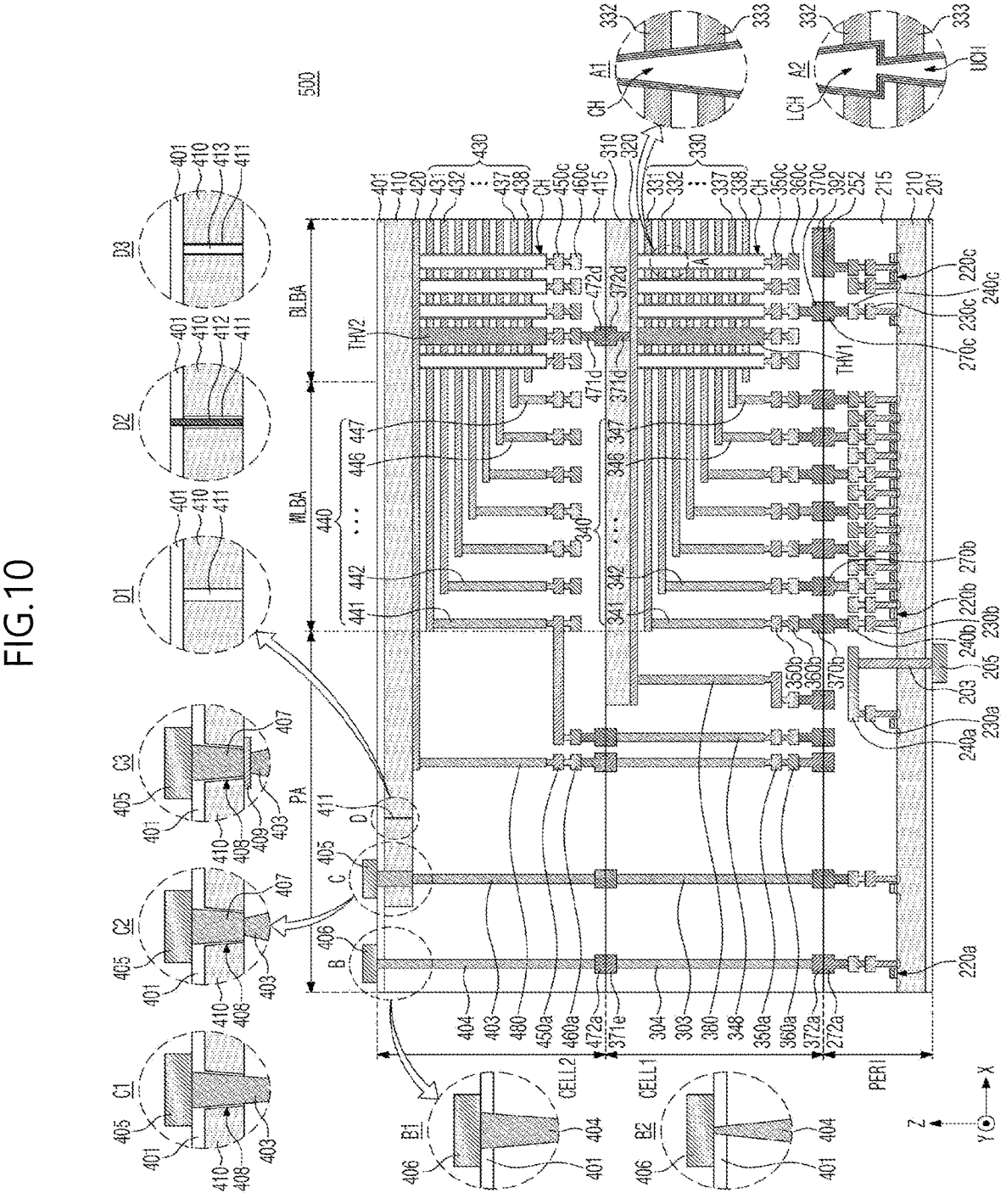
FIG. 10 is a sectional view illustrating a memory device having a C2C structure according to an exemplary embodiment.

FIG. 10 is a sectional view illustrating a memory device having a C2C structure according to an embodiment of the present disclosure. Referring to FIG. 10, the memory device 500 may include at least one upper chip including a cell region. For example, as illustrated in FIG. 10, the memory device 500 may be implemented to include two upper chips. However, this is illustrative, and the number of upper chips is not limited thereto.

In the case in which the memory device 500 is implemented to include two upper chips, the memory device 500 may be manufactured by separately manufacturing a first upper chip including a first cell region CELL1, a second upper chip including a second cell region CELL2, and a lower chip including a peripheral circuit region PERI and thereafter connecting the first upper chip, the second upper chip, and the lower chip by a bonding method. The first upper chip may be turned over and connected to the lower chip by the bonding method, and the second upper chip may also be turned over and connected to the first upper chip by the bonding method. In the following description, upper portions and lower portions of the first and second upper chips are defined based on before the first upper chip and the second upper chip are turned over. That is, in FIG. 10, an upper portion of the lower chip refers to an upper portion defined based on a +Z-axis direction, and the upper portions of the first and second upper chips refer to upper portions defined based on a Z-axis direction. However, this is illustrative, and only one of the first upper chip and the second upper chip may be turned over and connected by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220*a*, 220*b*, and 220*c* formed on the first substrate 210. An interlayer insulating layer 215 including one or more insulating layers may be provided on the plurality of circuit elements 220*a*, 220*b*, and 220*c*, and a plurality of metal lines connecting the plurality of circuit elements 220*a*, 220*b*, and 220*c* may be provided in the interlayer insulating layer 215. For example, the plurality of metal lines may include first metal lines 230*a*, 230*b*, and 230*c* connected with the plurality of circuit elements 220*a*, 220*b*, and 220*c*, respectively, and second metal lines 240*a*, 240*b*, and 240*c* formed on the first metal lines 230*a*, 230*b*, and 230*c*. The plurality of metal lines may be formed of at least one of various conductive materials. For example, the first metal lines 230*a*, 230*b*, and 230*c* may be formed of tungsten having a relatively high electrical resistivity, and the second metal lines 240*a*, 240*b*, and 240*c* may be formed of copper having a relatively low electrical resistivity.

In this specification, only the first metal lines 230*a*, 230*b*, and 230*c* and the second metal lines 240*a*, 240*b*, and 240*c* are illustrated and described. However, without being limited thereto, one or more additional metal lines may be further formed on the second metal lines 240*a*, 240*b*, and 240*c*. In this case, the second metal lines 240*a*, 240*b*, and 240*c* may be formed of aluminum. At least some of the additional metal lines formed on the second metal lines 240*a*, 240*b*, and 240*c* may be formed of copper having a lower electrical resistivity than the aluminum of the second metal lines 240*a*, 240*b*, and 240*c*.

The interlayer insulating layer 115 may be disposed on the first substrate 210 and may include an insulating material, such as silicon oxide or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (the Z-axis direction) perpendicular to an upper surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked in a direction (the Z-axis direction) perpendicular to an upper surface of the third substrate 410. The second substrate 310 and the third substrate 410 may be formed of various materials and may be, for example, silicon substrates, silicon-germanium substrates, germanium substrates, or substrates having mono-crystalline epitaxial layers grown on mono-crystalline silicon substrates. A plurality of channel structures CH may be formed in the first and second cell regions CELL1 and CELL2.

In an embodiment, as illustrated in A1, the channel structure CH may be provided in the bit line bonding region BLBA and may extend in the direction perpendicular to the upper surface of the second substrate 310 to penetrate the word lines 330, the string selection lines, and the ground selection line. The channel structure CH may include a data storage layer, a channel layer, and a buried insulating layer. The channel layer may be electrically connected with a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (a Y-axis direction) parallel to the upper surface of the second substrate 310.

In an embodiment, as illustrated in A2, the channel structure CH may include a lower channel LCH and an upper channel UCH connected to each other. For example, the channel structure CH may be formed through a process for the lower channel LCH and a process for the upper channel UCH. The lower channel LCH may extend in the direction perpendicular to the upper surface of the second substrate 310 and may penetrate the common source line 320 and the lower word lines 331 and 332. The lower channel LCH may include a data storage layer, a channel layer, and a buried insulating layer and may be connected with the upper channel UCH. The upper channel UCH may penetrate the upper word lines 333 to 338. The upper channel UCH may include a data storage layer, a channel layer, and a buried insulating layer, and the channel layer of the upper channel UCH may be electrically connected with the first metal line 350*c* and the second metal line 360*c*. As the length of a channel is increased, it may be difficult to form a channel having a constant width due to process reasons. The memory device 500 according to an embodiment of the present disclosure may include a channel having improved width uniformity through the lower channel LCH and the upper channel UCH formed by sequential processes.

In the case in which the channel structure CH includes the lower channel LCH and the upper channel UCH as illustrated in A2, a word line located near the boundary between the lower channel LCH and the upper channel UCH may be a dummy word line. For example, the word line 332 and the word line 333 that form the boundary between the lower channel LCH and the upper channel UCH may be dummy word lines. In this case, data may not be stored in memory cells connected to the dummy word lines. Alternatively, the number of pages corresponding to the memory cells connected to the dummy word lines may be smaller than the number of pages corresponding to memory cells connected to normal word lines. A voltage level applied to the dummy word lines may differ from a voltage level applied to the normal word lines, and thus an influence of a non-uniform channel width between the lower channel LCH and the upper channel UCH on an operation of the memory device may be reduced.

Meanwhile, it is illustrated in A2 that the number of lower word lines 331 and 332 penetrated by the lower channel LCH is smaller than the number of upper word lines 333 to 338 penetrated by the upper channel UCH. However, this is illustrative, and the present disclosure is not limited thereto. In another example, the number of lower word lines penetrated by the lower channel LCH may be equal to or larger than the number of upper word lines penetrated by the upper channel UCH. Furthermore, the above-described structure and connection relationship of the channel structure CH disposed in the first cell region CELL1 may be identically applied to the channel structure CH disposed in the second cell region CELL2.

In the bit line bonding region BLBA, a first through-electrode THV1 may be provided in the first cell region CELL1, and a second through-electrode THV2 may be provided in the second cell region CELL2. As illustrated in FIG. 10, the first through-electrode THV1 may penetrate the common source line 320 and the plurality of word lines 330. However, this is illustrative, and the first through-electrode THV1 may additionally penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In an embodiment, the first through-electrode THV1 and the second through-electrode THV2 may be electrically connected through a first through-metal pattern 372*d* and a second through-metal pattern 472*d*. The first through-metal pattern 372*d* may be formed on a lower side of the first upper chip including the first cell region CELL1, and the second through-metal pattern 472*d* may be formed on an upper side of the second upper chip including the second cell region CELL2. The first through-electrode THV1 may be electrically connected with the first metal line 350*c* and the second metal line 360*c*. A lower VIA 371*d* may be formed between the first through-electrode THV1 and the first through-metal pattern 372*d*, and an upper VIA 471*d* may be formed between the second through-electrode THV2 and the second through-metal pattern 472*d*. The first through-metal pattern 372*d* and the second through-metal pattern 472*d* may be connected by a bonding method.

Furthermore, in the bit line bonding region BLBA, an upper metal pattern 252 may be formed on the uppermost metal layer of the peripheral circuit region PERI, and an upper metal pattern 392 having the same shape as the upper metal pattern 252 may be formed on the uppermost metal layer of the first cell region CELL1. The upper metal pattern 392 of the first cell region CELL1 and the upper metal pattern 252 of the peripheral circuit region PERI may be electrically connected to each other by a bonding method. In the bit line bonding region BLBA, the bit line 360c may be electrically connected with a page buffer included in the peripheral circuit region PERI. For example, some of the circuit elements 220c of the peripheral circuit region PERI may provide a page buffer, and the bit line 360c may be electrically connected with the circuit elements 220c providing the page buffer through an upper bonding metal 370c of the first cell region CELL1 and an upper bonding metal 270c of the peripheral circuit region PERI".

Continuously referring to FIG. 10, in the word line bonding region WLBA, the word lines 330 of the first cell region CELL1 may extend in a second direction (an X-axis direction) parallel to the upper surface of the second substrate 310 and may be connected with a plurality of cell contact plugs 340 (341 to 347). A first metal line 350b and a second metal line 360b may be sequentially connected to upper portions of the cell contact plugs 340 connected to the word lines 330. In the word line bonding region WLBA, the cell contact plugs 340 may be connected with the peripheral circuit region PERI through an upper bonding metal 370b of the first cell region CELL1 and an upper bonding metal 270b of the peripheral circuit region PERI.

The cell contact plugs 340 may be electrically connected with a row decoder included in the peripheral circuit region PERI. For example, some of the circuit elements 220b of the peripheral circuit region PERI may provide a row decoder, and the cell contact plugs 340 may be electrically connected with the circuit elements 220b providing the row decoder through the upper bonding metal 370b of the first cell region CELL1 and the upper bonding metal 270b of the peripheral circuit region PERI. In an embodiment, an operating voltage of the circuit elements 220b that provide the row decoder may differ from an operating voltage of the circuit elements 220c that provide the page buffer. For example, the operating voltage of the circuit elements 220c that provide the page buffer may be greater than the operating voltage of the circuit elements 220b that provide the row decoder.

Likewise, in the word line bonding region WLBA, the word lines 430 of the second cell region CELL2 may extend in the second direction (the X-axis direction) parallel to the upper surface of the third substrate 410 and may be connected with a plurality of cell contact plugs 440 (441 to 447). The cell contact plugs 440 may be connected with the peripheral circuit region PERI through an upper metal pattern of the second cell region CELL2, a lower metal pattern and an upper metal pattern of the first cell region CELL1, and a cell contact plug 348.

In the word line bonding region WLBA, the upper bonding metal 370b may be formed in the first cell region CELL1, and the upper bonding metal 270b may be formed in the peripheral circuit region PERI. The upper bonding metal 370b of the first cell region CELL1 and the upper bonding metal 270b of the peripheral circuit region PERI may be electrically connected to each other by a bonding method. The upper bonding metal 370b and the upper bonding metal 270b may be formed of aluminum, copper, or tungsten.

In the external pad bonding region PA, a lower metal pattern 371e may be formed on a lower portion of the first cell region CELL1, and an upper metal pattern 472a may be formed on an upper portion of the second cell region CELL2. The lower metal pattern 371e of the first cell region CELL1 and the upper metal pattern 472a of the second cell region CELL2 may be connected by a bonding method in the external pad bonding region PA. Likewise, an upper metal pattern 372a may be formed on an upper portion of the first cell region CELL1, and an upper metal pattern 272a may be formed on an upper portion of the peripheral circuit region PERI. The upper metal pattern 372a of the first cell region CELL1 and the upper metal pattern 272a of the peripheral circuit region PERI may be connected to each other by a bonding method.

Common source line contact plugs 380 and 480 may be disposed in the external pad bonding region PA. The common source line contact plugs 380 and 480 may be formed of a conductive material, such as metal, a metal compound, or doped poly-silicon. The common source line contact plug 380 of the first cell region CELL1 may be electrically connected with the common source line 320, and the common source line contact plug 480 of the second cell region CELL2 may be electrically connected with the common source line 420. A first metal line 350a and a second metal line 360a may be sequentially stacked on an upper portion of the common source line contact plug 380 of the first cell region CELL1, and a first metal line 450a and a second metal line 460a may be sequentially stacked on an upper portion of the common source line contact plug 480 of the second cell region CELL2.

Input/output pads 205, 405, and 406 may be disposed in the external pad bonding region PA. Referring to FIG. 10, a lower insulating layer 201 may cover a lower surface of the first substrate 210, and the first input/output pad 205 may be formed on the lower insulating layer 201. The first input/output pad 205 may be connected with at least one of the plurality of circuit elements 220a disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 and may electrically isolate the first input/output contact plug 203 from the first substrate 210.

An upper insulating layer 401 may be formed on the third substrate 410 to cover the upper surface of the third substrate 410. The second input/output pad 405 and/or the third input/output pad 406 may be disposed on the upper insulating layer 401. The second input/output pad 405 may be connected with at least one of the plurality of circuit elements 220a disposed in the peripheral circuit region PERI through second input/output contact plugs 403 and 303, and the third input/output pad 406 may be connected with at least one of the plurality of circuit elements 220a disposed in the peripheral circuit region PERI through third input/output contact plugs 404 and 304.

In an embodiment, the third substrate 410 may not be disposed in the regions in which the input/output contact plugs are disposed. For example, as illustrated in B, the third input/output contact plug 404 may be separated from the third substrate 410 in a direction parallel to the upper surface of the third substrate 410, may penetrate an interlayer insulating layer 415 of the second cell region CELL2, and may be connected to the third input/output pad 406. In this case, the third input/output contact plug 404 may be formed through various processes.

For example, as illustrated in B1, the third input/output contact plug 404 may extend in the third direction (the Z-axis direction) and may have an increasing diameter toward the upper insulating layer 401. That is, while the channel structure CH described with reference to A1 has a decreasing diameter toward the upper insulating layer 401, the third input/output contact plug 404 may have an increasing diameter toward the upper insulating layer 401. For example, the third input/output contact plug 404 may be formed after the second cell region CELL2 and the first cell region CELL1 are coupled by a bonding method.

For example, as illustrated in B2, the third input/output contact plug 404 may extend in the third direction (the Z-axis direction) and may have a decreasing diameter toward the upper insulating layer 401. That is, likewise to the channel structure CH, the third input/output contact plug 404 may have a decreasing diameter toward the upper insulating layer 401. For example, the third input/output contact plug 404 may be formed together with the cell contact plugs 440 before the second cell region CELL2 and the first cell region CELL1 are coupled by a bonding method.

In an embodiment, an input/output contact plug may be disposed to overlap the third substrate 410. For example, as illustrated in C, the second input/output contact plug 403 may be formed through the interlayer insulating layer 415 of the second cell region CELL2 in the third direction (the Z-axis direction) and may be electrically connected to the second input/output pad 405 through the third substrate 410. In this case, a connection structure of the second input/output contact plug 403 and the second input/output pad 405 may be implemented in various ways.

For example, as illustrated in C1, an opening 408 may be formed through the third substrate 410, and the second input/output contact plug 403 may be directly connected to the second input/output pad 405 through the opening 408 formed in the third substrate 410. In this case, as illustrated in C1, the second input/output contact plug 403 may have an increasing diameter toward the second input/output pad 405. However, this is illustrative, and the second input/output contact plug 403 may have a decreasing diameter toward the second input/output pad 405.

For example, as illustrated in C2, the opening 408 may be formed through the third substrate 410, and a contact 407 may be formed in the opening 408. One end portion of the contact 407 may be connected to the second input/output pad 405, and an opposite end portion of the contact 407 may be connected to the second input/output contact plug 403. Accordingly, the second input/output contact plug 403 may be electrically connected to the second input/output pad 405 through the contact 407 in the opening 408. In this case, as illustrated in C2, the contact 407 may have an increasing diameter toward the second input/output pad 405, and the second input/output contact plug 403 may have a decreasing diameter toward the second input/output pad 405. For example, the third input/output contact plug 403 may be formed together with the cell contact plugs 440 before the second cell region CELL2 and the first cell region CELL1 are coupled by a bonding method, and the contact 407 may be formed after the second cell region CELL2 and the first cell region CELL1 are coupled by the bonding method.

For example, as illustrated in C3, a stopper 409 may be additionally formed on an upper surface of the opening 408 of the third substrate 410. The stopper 409 may be a metal line formed on the same layer as the common source line 420. However, this is illustrative, and the stopper 409 may be a metal line formed on the same layer as at least one of the word lines 430. The second input/output contact plug 403 may be electrically connected to the second input/output pad 405 through the contact 407 and the stopper 409.

Meanwhile, similarly to the second and third input/output contact plugs 403 and 404 of the second cell region CELL2, the second and third input/output contact plugs 303 and 304 of the first cell region CELL1 may have a decreasing diameter toward the lower metal pattern 371e, or may have an increasing diameter toward the lower metal pattern 371e.

Meanwhile, in some embodiments, a slit 411 may be formed in the third substrate 410. For example, the slit 411 may be formed at any position in the external pad bonding region PA. For example, as illustrated in D, the slit 411 may be located between the second input/output pad 405 and the cell contact plugs 440 when viewed on a plane. However, this is illustrative, and the slit 411 may be formed such that the second input/output pad 405 is located between the slit 411 and the cell contact plugs 440 when viewed on the plane.

For example, as illustrated in D1, the slit 411 may be formed through the third substrate 410. For example, the slit 411 may be used to prevent the third substrate 410 from being finely cracked when the opening 408 is formed. However, this is illustrative, and the slit 411 may be formed to have a depth ranging from about 60% to about 70% of the thickness of the third substrate 410.

For example, as illustrated in D2, a conductive material 412 may be formed in the slit 411. For example, the conductive material 412 may be used to discharge a leakage current generated while circuit elements in the external pad bonding region PA are driven. In this case, the conductive material 412 may be connected to an external ground line.

For example, as illustrated in D3, an insulating material 413 may be formed in the slit 411. For example, the insulating material 413 may be formed to electrically isolate the second input/output pad 405 and the second input/output contact plug 403 disposed in the external pad bonding region PA from the word line bonding region WLBA. An influence of a voltage provided through the second input/output pad 405 on a metal layer disposed on the third substrate 410 in the word line bonding region WLBA may be interrupted by forming the insulating material 413 in the slit 411.

Meanwhile, in some embodiments, the first to third input/output pads 205, 405, and 406 may be selectively formed. For example, the memory device 500 may be implemented to include only the first input/output pad 205 disposed on the first substrate 201, only the second input/output pad 405 disposed on the third substrate 410, or only the third input/output pad 406 disposed on the upper insulating layer 401.

Meanwhile, in some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the peripheral circuit region PERI and the first cell region CELL1 are bonded to each other, and an insulating layer for covering an upper surface of the common source line 320 or a conductive layer for connection may be formed. Similarly, the third substrate 410 of the second cell region CELL2 may be removed before or after the first cell region CELL1 and the second cell region CELL2 are bonded to each other, and the upper insulating layer 401 for covering an upper surface of the common source line 420 or a conductive layer for connection may be formed.

As described above, the semiconductor chip according to the embodiment of the present disclosure may include, in the four corner portions thereof, the chamfer regions having different shapes and sizes depending on the presence or absence of the pad or the design arrangement of the internal circuit structure. Accordingly, the present disclosure may be effectively used for a semiconductor chip having a three-dimensional structure in which memory cells are stacked in a direction perpendicular to a semiconductor substrate, a semiconductor chip having a COP structure in which a memory cell array region is located on a peripheral circuit region, and a semiconductor chip having a C2C structure in which an upper chip having a memory cell array formed therein and a lower chip having a peripheral circuit formed therein are connected by a bonding technology.

The above-described contents are specific embodiments for carrying out the present disclosure. The present disclosure includes not only the above-described embodiments but also embodiments that can be made through a simple design change or can be easily modified. Furthermore, the present disclosure includes technologies that can be carried out by easily modifying the embodiments. Accordingly, the scope of the present disclosure should not be determined by the above-described embodiments and should be determined by the accompanying claims and the equivalents thereof.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A semiconductor chip comprising:
a guard ring surrounding edges of a semiconductor substrate;
an internal circuit structure formed on the semiconductor substrate and including a memory cell array region and a peripheral circuit region;
a crack detection circuit located between the guard ring and the internal circuit structure and configured to detect whether a crack occurs;
a first chamfer region defined as an interior region of a right triangle with a first point, a second point, and a third point as vertices, wherein a first horizontal detection line and a first corner detection line of the crack detection circuit meet each other at the first point, the first corner detection line and a first vertical detection line of the crack detection circuit meet each other at the second point, and an extension line of the first horizontal detection line and an extension line of the first vertical detection line of the crack detection circuit meet each other at the third point; and
a second chamfer region defined as an interior region of a right triangle with a fourth point, a fifth point, and a sixth point as vertices, wherein the first vertical detection line and a second corner detection line of the crack detection circuit meet each other at the fourth point, the second corner detection line and a second horizontal detection line of the crack detection circuit meet each other at the fifth point, and an extension line of the first vertical detection line and an extension line of the second horizontal detection line of the crack detection circuit meet each other at the sixth point,
wherein a length between the fourth point and the sixth point of the second chamfer region differs from a length between the second point and the third point of the first chamfer region due to a pad located between the second horizontal detection line and the internal circuit structure.

2. The semiconductor chip of claim 1, wherein the length between the fourth point and the sixth point of the second chamfer region is greater than the length between the second point and the third point of the first chamfer region.

3. The semiconductor chip of claim 1, further comprising:
a third chamfer region defined as an interior region of a right triangle with a seventh point, an eighth point, and a ninth point as vertices, wherein the second horizontal detection line and a third corner detection line of the crack detection circuit meet each other at the seventh point, the third corner detection line and a second vertical detection line of the crack detection circuit meet each other at the eighth point, and an extension line of the second horizontal detection line and an extension line of the second vertical detection line of the crack detection circuit meet each other at the ninth point,
wherein a length between the fifth point and the sixth point of the second chamfer region differs from a length between the seventh point and the ninth point of the third chamfer region due to a design arrangement of the internal circuit structure.

4. The semiconductor chip of claim 3, further comprising:
a fourth chamfer region defined as an interior region of a right triangle with a tenth point, an eleventh point, and a twelfth point as vertices, wherein the second vertical detection line and a fourth corner detection line of the crack detection circuit meet each other at the tenth point, the fourth corner detection line and the first horizontal detection line of the crack detection circuit meet each other at the eleventh point, and an extension line of the second vertical detection line and an extension line of the first horizontal detection line of the crack detection circuit meet each other at the twelfth point,
wherein a length between the eighth point and the ninth point of the third chamfer region differs from a length between the tenth point and the twelfth point of the fourth chamfer region due to the pad located between the second horizontal detection line and the internal circuit structure.

5. The semiconductor chip of claim 4, wherein the length between the eighth point and the ninth point of the third chamfer region is greater than the length between the tenth point and the twelfth point of the fourth chamfer region.

6. The semiconductor chip of claim 5, wherein a length between the first point and the third point of the first chamfer region differs from a length between the eleventh point and the twelfth point of the fourth chamfer region due to the design arrangement of the internal circuit structure.

7. The semiconductor chip of claim 6, where a metal pattern structure is located in the first to fourth chamfer regions.

8. The semiconductor chip of claim 1, wherein the internal circuit structure has a COP structure in which the memory cell array region is located on the peripheral circuit region, and
wherein memory cells are stacked in a direction perpendicular to the semiconductor substrate in the memory cell array region.

9. The semiconductor chip of claim 8, wherein in the memory cell array region, slopes of memory cells stacked in the direction perpendicular to the semiconductor substrate in the vicinity of the first horizontal detection line and the second horizontal detection line differ from each other due to a position of the pad.

10. The semiconductor chip of claim 9, wherein a zone without transistors is located between the first horizontal detection line and the internal circuit structure.

11. The semiconductor chip of claim 1, wherein magnitudes of interior angles at the first point and the second point of the first chamfer region differ from each other due to a design arrangement of the internal circuit structure.

12. A semiconductor chip comprising:
a guard ring surrounding edges of a semiconductor substrate;
an internal circuit structure formed on the semiconductor substrate and including a memory cell array region and a peripheral circuit region;
a crack detection circuit located between the guard ring and the internal circuit structure and configured to detect whether a crack occurs;
a first chamfer region defined as an interior region of a right triangle with a first point, a second point, and a third point as vertices, wherein a first horizontal detection line and a first corner detection line of the crack detection circuit meet each other at the first point, the first corner detection line and a first vertical detection line of the crack detection circuit meet each other at the second point, and an extension line of the first horizontal detection line and an extension line of the first vertical detection line of the crack detection circuit meet each other at the third point;
a second chamfer region defined as an interior region of a right triangle with a fourth point, a fifth point, and a sixth point as vertices, wherein the first vertical detection line and a second corner detection line of the crack detection circuit meet each other at the fourth point, the second corner detection line and a second horizontal detection line of the crack detection circuit meet each other at the fifth point, and an extension line of the first vertical detection line and an extension line of the second horizontal detection line of the crack detection circuit meet each other at the sixth point; and
first edge transistors located between main peripheral circuits of the peripheral circuit region and the second horizontal detection line;
a pad between the second horizontal detection line and the internal circuit structure; and
wherein a zone without transistors is located between the first horizontal detection line and the internal circuit structure, and magnitudes of interior angles at the first point and the second point of the first chamfer region differ from each other, and
wherein magnitudes of interior angles at the fourth point and the fifth point of the second chamfer region differ from each other due to the first edge transistors and the pad.

13. The semiconductor chip of claim 12, further comprising:
wherein a length between the fourth point and the sixth point of the second chamfer region differs from a length between the second point and the third point of the first chamfer region due to the pad.

14. The semiconductor chip of claim 13, wherein the internal circuit structure has a COP structure in which the memory cell array region is located on the peripheral circuit region, and
wherein memory cells are stacked in a direction perpendicular to the semiconductor substrate in the memory cell array region.

15. The semiconductor chip of claim 12, further comprising:

second edge transistors between the main peripheral circuits of the peripheral circuit region and the first vertical detection line,
wherein a length between the first point and the third point of the first chamfer region and a length between the fifth point and the sixth point of the second chamfer region are determined due to the second edge transistors.

16. The semiconductor chip of claim 15, further comprising:
a third chamfer region defined as an interior region of a right triangle with a seventh point, an eighth point, and a ninth point as vertices, wherein the second horizontal detection line and a third corner detection line of the crack detection circuit meet each other at the seventh point, the third corner detection line and a second vertical detection line of the crack detection circuit meet each other at the eighth point, and an extension line of the second horizontal detection line and an extension line of the second vertical detection line of the crack detection circuit meet each other at the ninth point;
a fourth chamfer region defined as an interior region of a right triangle with a tenth point, an eleventh point, and a twelfth point as vertices, wherein the second vertical detection line and a fourth corner detection line of the crack detection circuit meet each other at the tenth point, the fourth corner detection line and the first horizontal detection line of the crack detection circuit meet each other at the eleventh point, and an extension line of the second vertical detection line and an extension line of the first horizontal detection line of the crack detection circuit meet each other at the twelfth point; and
third edge transistors between the main peripheral circuits of the peripheral circuit region and the second vertical detection line,
wherein a length between the seventh point and the ninth point of the third chamfer region and a length between the eleventh point and the twelfth point of the fourth chamfer region are determined due to the third edge transistors.

17. A semiconductor chip comprising:
an upper chip including a memory cell array region; and
a lower chip including a peripheral circuit region, the lower chip being connected to the upper chip by a bonding method,
wherein each of the upper chip and the lower chip includes:
a guard ring configured to surround edges of a semiconductor substrate;
an internal circuit structure formed on the semiconductor substrate, the internal circuit structure including the memory cell array region or the peripheral circuit region; and
a crack detection circuit located between the guard ring and the internal circuit structure and configured to detect whether a crack occurs,
wherein the semiconductor chip further comprises:
a first chamfer region defined as an interior region of a right triangle with a first point, a second point, and a third point as vertices, wherein a first horizontal detection line and a first corner detection line of the crack detection circuit meet each other at the first point, the first corner detection line and a first vertical detection line of the crack detection circuit meet each other at the second point, and an extension line of the first horizontal detection line and an extension line of the first vertical detection line of the crack detection circuit meet each other at the third point; and a second chamfer region defined as an interior region of a right triangle with a fourth point, a fifth point, and a sixth point as vertices, wherein the first vertical detection line and a second corner detection line of the crack detection circuit meet each other at the fourth point, the second corner detection line and a second horizontal detection line of the crack detection circuit meet each other at the fifth point, and an extension line of the first vertical detection line and an extension line of the second horizontal detection line of the crack detection circuit meet each other at the sixth point, and wherein a length between the fourth point and the sixth point of the second chamfer region is greater than a length between the second point and the third point of the first chamfer region due to a pad located between the second horizontal detection line and the internal circuit structure.

18. The semiconductor chip of claim 17, further comprising:

a third chamfer region defined as an interior region of a right triangle with a seventh point, an eighth point, and a ninth point as vertices, wherein the second horizontal detection line and a third corner detection line of the crack detection circuit meet each other at the seventh point, the third corner detection line and a second vertical detection line of the crack detection circuit meet each other at the eighth point, and an extension line of the second horizontal detection line and an extension line of the second vertical detection line of the crack detection circuit meet each other at the ninth point, wherein a length between the fifth point and the sixth point of the second chamfer region differs from a length between the seventh point and the ninth point of the third chamfer region due to a design arrangement of the internal circuit structure.

19. The semiconductor chip of claim 18, further comprising:

a fourth chamfer region defined as an interior region of a right triangle with a tenth point, an eleventh point, and a twelfth point as vertices, wherein the second vertical detection line and a fourth corner detection line of the crack detection circuit meet each other at the tenth point, the fourth corner detection line and the first horizontal detection line of the crack detection circuit meet each other at the eleventh point, and an extension line of the second vertical detection line and an extension line of the first horizontal detection line of the crack detection circuit meet each other at the twelfth point, wherein a length between the eighth point and the ninth point of the third chamfer region differs from a length between the tenth point and the twelfth point of the fourth chamfer region due to the pad located between the second horizontal detection line and the internal circuit structure.

20. The semiconductor chip of claim 17, wherein a zone without transistors is located between the first horizontal detection line and the internal circuit structure.

* * * * *